April 14, 1970 K. SIEBERTZ ET AL 3,506,888

VOLTAGE-RESPONSIVE SEMICONDUCTOR CAPACITOR

Filed Nov. 16, 1967

United States Patent Office 3,506,888
Patented Apr. 14, 1970

3,506,888

VOLTAGE-RESPONSIVE SEMICONDUCTOR CAPACITOR

Karl Siebertz, Munich-Obermenzing, and Ernst Hofmeister, Munich, Germany, assignors to Siemens Aktiengesellschaft, Berlin, Germany, a corporation of Germany Filed Nov. 16, 1967, Ser. No. 683,516
Claims priority, application Germany, Dec. 22, 1966, S 107,544
Int. Cl. H01l 5/00
U.S. Cl. 317—234 6 Claims

ABSTRACT OF THE DISCLOSURE

A voltage-responsive capacitor (varactor) has a crystalline semiconductor body of one conductivity type in which a multiplicity of mutually spaced regions of the other conductivity type are embedded in a grid arrangement of planar-type elements which are all electrically connected in parallel and of which each forms a p–n junction. The spacing between the individual elements of the grid arrangement is sufficiently small to cause the space-charge zones of the p-n junctions to merge when blocking voltage is applied, thus considerably increasing the effected change in capacitance.

Our invention relates to voltage-responsively variable capacitors of the varactor type in which the capacitance is constituted by the effect of the space-charge zone of p–n junctions which are biased by an inverse voltage, these junctions being formed by regions of one conductivity type within a semiconductor of the other conductivity type.

It is known to utilize the voltage-responsive capacitance of such a device, localized in the space-charge zone of a p–n junction, for the purpose of controlling the capacitor. Desirable for such control, for example in high-frequency tuners or parametric amplifiers, is a marked dependence of the capacitance upon the applied voltage It has therefore been attempted to increase the voltge response, that is, the rise in capacitance caused by the application or change of applied voltage. In known varactors, therefore, the region of the semiconductor body containing the p–n junction with its space-charge zone, has been so designed geometrically that the space-charge zone expands or "breathes" into a region of smaller cross section as the applied voltage increases. Since the capacitance of inversely biased p–n junctions decreases with increasing blocking (inverse) voltage—this applying fundamentally to the capacitance of any p–n junction—the decrease in cross section results in further reducing the capacitance. This can be explained in a simple manner by looking upon the p–n junction as if it were a model of a plate-type capacitor, so that the reduction of the cross section in the region of the space-charge zone corresponds to a reduction in area of the capacitor "plates."

The increase in capacitance change attainable by such an expedient, however, is limited. For example, if the p–n junction is constituted in form of a mesa diode, there will result a reduction in cross section of the p–n junction area, at least with respect to one side of the junction, due to the fact that the cross section of the mesa configuration decreases toward the mesa top. Hence if with such a diode the voltage dependence and consequently the rise in capacitance is to be made large, the slope angle of the mesa must be made small. However, mesa diodes with a small angle of slope are technologically difficult to produce since it is hardly feasible to properly etch such structures.

It has also been proposed for the production of capacitance-forming p–n junctions to provide for dopant gradients which increase the voltage dependency beyond the law of voltage dependence applying to abrupt p–n junctions. In this case, the planar technique can be employed, which is advantageous over the above-mentioned method of mesa production. However, the dopant gradient is accompanied with an increase in path resistance so that the loss angle of the capacitor is impaired.

It is an object of our invention to devise a voltage-responsive semiconductor capacitor whose capacitance varies to a greater extent in response to voltage changes than the capacitance in varactors as heretofore known.

Another object of the invention, conjointly with the one just mentioned, is to afford a technologically simple production of such capacitors.

To achieve these objects, and in accordance with our invention, the crystalline semiconductor body of a voltage-responsive variable capacitor whose capacitance is constituted by the space-charge zone of inversely biased p–n junctions, comprises a first or main portion of one conductivity type, namely p-type or n-type, and a multitude of mutually spaced regions of the other conductivity type which are embedded in the main portion as a raster-grid arrangement of planar-type elements and form respective electrically parallel connected p–n junctions with the main portion. The spacing between the element regions is so chosen that the individual space-charge zones of the p–n junctions, these zones protruding into the main portion of the semiconductor body, will merge with each other when a sufficient inverse voltage is applied to the capacitor.

The foregoing and further details of capacitors according to the invention will be described in the following with reference to embodiments of the invention illustrated by way of example on the accompanying drawing in which.

Figure 1:
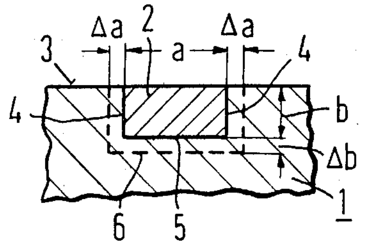
FIG. 1 is a partial section through the semiconductor body of a capacitor according to the invention showing the portion wherein one of the p-n junctions is located.

Referring to FIG. 1, there is shown a crystalline semiconductor 1 of one type of conductivity in which a region 2 of the other conductivity type is produced by the conventional diffusion technique employing a mask. The diffused region 2 forms with the unaffected portion of the body 1 at a p-n junction whose bottom 5 extends substantially parallel to the surface 3 of the semiconductor crystal 1 and whose perimetric portion 4 extends substantially perpendicularly to the surface 3. The region 2 in this embodiment is produced by diffusion through a mask window of square shape. The bottom portion 5 of the p-n junction has the width *a* and the perimetric portion 4 of the junction has the penetrating depth $b$. When an inverse (blocking) voltage is applied across the p-n junction, the space-charge zone symbolically represented by a broken line 6 will widen.

The total area ($F_o$) of the p-n junction which determines the capacitance, amounts with the stated dimensions to:

$$F_o = a^2 + 4ab$$

Figure 2:
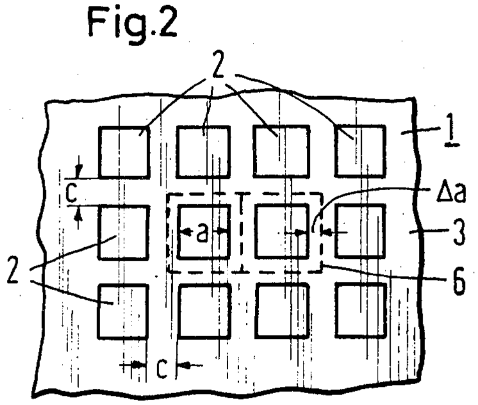
FIG. 2 is a plan view onto the capacitor, the appertaining electrode or conductors being removed.
Figure 3:
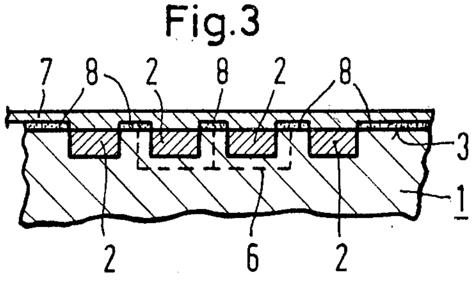
FIG. 3 is a cross section through part of the capacitor shown in FIG. 2.

As will be seen from FIGS. 2 and 3, a large number of regions 2 are embedded in the semiconductor main portion 1 adjacent to its surface 3 so as to form respective planar elements conjointly constituting a raster or grid pattern. The regions or capacitor elements 2 are connected electrically in parallel. This is done by attaching to all of these elements a conductor or electrode 7 which is insulated from the main body portion 1 by an insulating intermediate layer 8, for example of silicon dioxide, and which constitutes one of the terminals or electrodes of the capacitor, the other terminal or electrode being conductively joined with the opposite face (not shown) of the body 1. The coating 8 may be produced in conjunction with the above-mentioned indiffusion of the regions 2 as follows. First the surface of the semiconductor body 1, consisting, for example, of n-type silicon, is oxidized to form a surface coating 8 of silicon dioxide which entirely covers the top surface 3. Then a mask corresponding to the illustrated pattern is varnished or, photo-deposited on top of the coating, and the square areas beneath which the indiffusion of acceptor dopant is to be effected are etched away. Thereafter the dopant substance is diffused into the body 1 down to the desired depth in order to produce the grid arrangement of p-type capacitor regions 2. Ultimately, a foil of conduction metal is bonded to the top surface to produce the terminal electrode 7.

If in such or any other suitable manner a multiplicity of regions 2 in the semiconductor 1, having a mutual spacing $c$, are electrically connected in parallel, the total area ($F_{on}$) of $n$ parallel connected p-n junction areas is determined by:

$$F_{on} = n \cdot (a^2 + 4ab)$$

Due to the growth of the space-charge zone resulting from the application of the blocking voltage, the width $a$ increases by the amount $2\Delta a$ and the penetrating depth increases by $\Delta b$. It can be assumed that $\Delta a$ is approximately equal to $\Delta b$.

If according to the invention the raster spacing $c$ is so chosen that $$c < 2\Delta a$$

the application of the blocking voltage and the resulting increase in $\Delta a$ will make the lateral sides of the indiffused regions, or rather the resulting space-charge zones, vanish. That is, all of the space-charge zones now merge to a single zone and only the p-n junction portions that extend parallel to the surface 3 now contribute to the active junction area.

After such disappearance of the lateral junction of space-charge zone areas, the total active junction area ($F_n$) is determined by the equation:

$$F_n = n \cdot (a + 2\Delta a)^2$$

It will be recognized that the normal capacitance variation resulting from the widening of the barrier layer is now accompanied by a capacitance reduction resulting from the reduction in total active area which takes place commencing approximately $4n \cdot ab$.

Obviously, the invention is not limited to embodiments in which the p-n junctions formed by the regions 2 are square in shape. The p-n junctions may also have rectangular, comb-like, meander-shaped, semispherical or semicylindrical configuration. The corresponding diffusion windows of the mask used for the indiffusion technique are then to be given a corresponding square, rectangular or circular shape.

Figure 4:
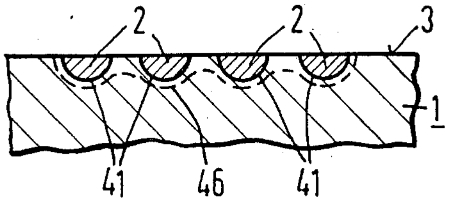
FIG. 4 is a partial cross section of another embodiment of a capacitor according to the invention.

Thus, an embodiment in which the p-n regions are semicylindrical is represented by the cross section shown in FIG. 4, the electrode or terminal as well as the intermediate insulation being omitted. The reference numerals in FIG. 4 correspond to those of the preceding illustrations with respect to functionally equivalent items. With a parallel connection of the individual p-n junctions 41, the application of a blocking voltage causes the space-charge zones to grow until they will merge with each other as is represented by the broken line 46. This also results in reducing the total active area that contributes to the capacitance of the device and consequently effects an increase in the rise of capacitance of the entire capacitor.

FIG. 2 shows an embodiment in which the p-n junctions extend along rectangular contours and the individual regions 2 in the semiconductor body 1 are comparable to the times of a comb structure although they are not joined with one another. The electrical conditions are in accordance with those described above with reference to the preceding embodiments.

Figures 5, 6:
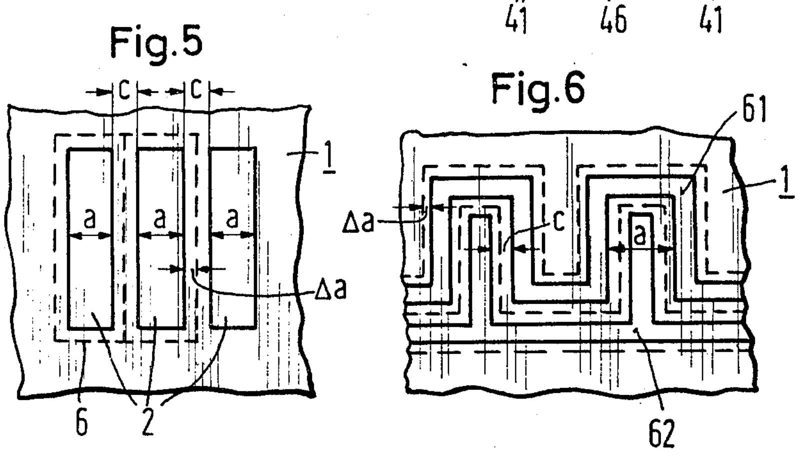
FIGS. 5 and 6 are plan views of two other capacitors according to the invention shown in the same manner as FIG. 2.

The capacitor according to FIG. 6 exhibits a combined meander and comb structure. The meander is formed by a zone 61 of a conductivity type opposed to that of the semiconductor body 1. Combined with the meander zone 61 is a comblike region 62 whose type of conductivity is likewise opposed to that of the semiconductor body 1. The magnitudes $a$, $\Delta a$ and $c$ correspond to those defined above and the same relations apply as in the embodiments of FIGS. 1, 2, 3 and 5.

As mentioned above, the devices describing the foregoing are readily producible by known masking and diffusion techniques as generally employed in planar techniques of semiconductor manufacture.

Furthermore, the likewise known technique of providing for specific dopant distributions on the two sides of the p-n junctions may be applied in order to obtain given properties, for example a slight loss angle or a given functional dependence of the capacitance upon the applied voltage. This can be done particularly by providing for a doping gradient such as giving the p-type regions a higher dopant concentration than the n-type regions, for example.

To those skilled in the art it will be apparent from a study of this disclosure that our invention permits of various other modifications with respect to the shape, design and materials employed as well as the number and arrangement of the various p-type and n-type regions, thus embodying the invention in devices other than particularly illustrated and described herein, without departing from the essential features of our invention and within the scope of the claims annexed hereto.

We claim:

1. In a voltage-responsive capacitor having a semiconductor body in including p-n junction for producing a variable capacitance upon inversely biasing the space-charge zone thereof, the improvement comprising said semiconductor body having a portion of one conductivity type and a multiplicity of mutually spaced regions of the other conductivity type forming a raster grid pattern of planar-type elements having p-n junctions in said portion, said elements being electrically interconnected in parallel with the responsive space-charge zones of said p-n junctions protruding into said portions, said elements being spaced sufficiently for mutually separating said zones at 0 bias voltage and sufficiently close, one to another, for mutually intermerging said zones upon application of blocking voltage to said p-n junctions.

2. In a capacitor according to claim 1, said regions and the p-n junctions formed thereby having substantially rectangular shape.

3. In a capacitor according to claim 2, said regions and the p-n junctions formed thereby having substantially square shape and being all arranged parallel to each other in two mutually perpendicular rows, the mutual spacing between each two of said regions being substantially the same in each of said two rows.

4. In a capacitor according to claim 1, said regions and the p-n junctions formed thereby having a substantially semi-circular cross-sectional shape.

5. In a capacitor according to claim 4, said regions and the p-n junctions formed thereby being approximately semispherical.

6. In a capacitor according to claim 4, said regions and the p-n junctions formed thereby being approximately semi-cylindrical.

References Cited

UNITED STATES PATENTS

| | | | |
|---|---|---|---|
| 3,025,438 | 3/1962 | Wegener | 317—235 |
| 3,227,896 | 1/1966 | Tezzner | 317—235 X |
| 3,252,003 | 5/1966 | Schmidt | 317—235 X |

JAMES D. KALLAM, Primary Examiner

U.S. Cl. X.R.

317—235